(12) United States Patent
Mallinson et al.

(10) Patent No.: US 7,259,704 B2
(45) Date of Patent: Aug. 21, 2007

(54) SYSTEM AND METHOD FOR COMPENSATING FOR ERROR IN A SIGMA DELTA CIRCUIT

(75) Inventors: Andrew Martin Mallinson, Kelowna (CA); Simon Jacques Damphousse, Kelowna (CA)

(73) Assignee: ESS Technology, Inc., Fremont, CA (US)

( * ) Notice: Subject to any disclaimer, the term of this patent is extended or adjusted under 35 U.S.C. 154(b) by 553 days.

(21) Appl. No.: 10/810,312

(22) Filed: Mar. 26, 2004

(65) Prior Publication Data

US 2004/0216007 A1 Oct. 28, 2004

Related U.S. Application Data

(60) Provisional application No. 60/458,909, filed on Mar. 28, 2003.

(51) Int. Cl.
H03M 3/00 (2006.01)
(52) U.S. Cl. ...................................................... 341/143
(58) Field of Classification Search ................ 341/143, 341/155, 144, 141
See application file for complete search history.

(56) References Cited

U.S. PATENT DOCUMENTS

| | | | | |
|---|---|---|---|---|
| 4,733,219 A | * | 3/1988 | Reusens et al. | ............... 341/50 |
| 5,124,703 A | * | 6/1992 | Kaneaki et al. | ............... 341/77 |
| 5,559,467 A | | 9/1996 | Smedley | |
| 5,563,535 A | | 10/1996 | Corry et al. | |
| 5,903,871 A | | 5/1999 | Terui et al. | |
| 5,974,089 A | | 10/1999 | Tripathi et al. | |
| 6,075,408 A | | 6/2000 | Kullstam et al. | |
| 6,091,303 A | | 7/2000 | Dent | |
| 6,147,634 A | * | 11/2000 | Rangan et al. | ............... 341/143 |
| 6,208,279 B1 | | 3/2001 | Oprescu | |
| 6,344,811 B1 | | 2/2002 | Melanson | |
| 6,373,334 B1 | * | 4/2002 | Melanson | ..................... 330/10 |
| 6,466,087 B2 | | 10/2002 | Ruha | |
| 6,504,427 B2 | | 1/2003 | Midya et al. | |
| 6,594,309 B1 | | 7/2003 | Botti et al. | |
| 6,794,930 B1 | | 9/2004 | Nurminen | |
| 6,795,004 B2 | | 9/2004 | Masuda et al. | |
| 2004/0165661 A1 | | 8/2004 | Braun | |

OTHER PUBLICATIONS

Jorge Varona, "Power Digital-to-Analog Conversion Using Sigma-Delta and Pulse Width Modulations," ECE1371 Analog Electronics II, ECE University of Toronto, pp. 1-14, 2001.

Erik Bresch and Wayne T. Padgett, "TMS320C67-Based Design of a Digital Audio Power Amplifier Introducing Novel Feedback Strategy," Rose-Hulman Institute of Technology, Electrical and Computer Engineering Department, pp. 1-16, 1999.

(Continued)

*Primary Examiner*—Brian Young
(74) *Attorney, Agent, or Firm*—Kenta Suzue; Haynes Beffel & Wolfeld LLP

(57) ABSTRACT

A system and method are provided for compensating for output error in a sigma delta circuit. The system includes an input for receiving an input signal and an output configured to output a output signal. The system further includes a summation component configured to add a first error voltage value, which is derived from an output signal, to an incoming input signal, and a subtraction component configured to subtract a second error voltage value, where the second error voltage value is derived from the adding of a first error voltage value to an incoming input signal.

11 Claims, 2 Drawing Sheets

OTHER PUBLICATIONS

K. P. Sozanski, R. Strzelecki and Z. Fedyczak, "Digital Control Circuit for Class-D Audio Power Amplifier," Power Electronics Specialists Conference, PESC 2001 IEEE 32nd Annual, vol. 2, pp. 1245-1250, 2001.

Morten Johansen and Karsten Nielsen, "A Review and Comparison of Digital PWM Methods for Digital Pulse Modulation Amplifier (PMA) Systems," 107th Convention of Audio Engineering Society, Sep. 24-27, 1999, New York, New York.

Thomas Taul, Karsten Nielsen and Michael A.E. Andersen, "Comparing Nonlinear with Linear Control Methods for Error Correction in Switching Audio Amplifier Output Stages," 104th Convention of Audio Engineering Society, May 16-19, 1998, Amsterdam.

Karsten Nielsen, "MECC—A Novel Control Method for High End Switching Audio Power Amplification," 105th Convention of Audio Engineering Society, Sep. 26-29, 1998, San Francisco, California.

Crilles Bak Rasmussen, "Hybrid Digital-Analog Feedback Audio Amplifiers," 2004 Dissertation, in cooperation with Bang & Olufsen ICEpower A/A, Lyngby 2004, Eksamensprojekt, NR. IMM-Thesis-2004-68. (Not Prior Art).

M. O. J. Hawksford, "Time-Quantized Frequency Modulation, Time-Domain Dither, Dispersive Codes, and Parametically Controlled Noise Shaping in SDM," J. Audio Eng. Soc., vol. 52, No. 6, pp. 587-617, Jun. 2004. (Not Prior Art).

D. Weiler, P.A. Nielsen, D. Hammerschmidt, O. Machul and B. J. Hosticka, "Single Bit Sigma-Delta Modulator with Nonlinear Quantization for µ-Law Coding," 23rd European Sold-State Circuits Conference, Southhampton, United Kingdom, Sep. 16-18, 1997.

D. Akselrod, S. Greenberg, S. Hava and V. Koifman, "Noise-Shaped Dynamic Element Matching Architecture for Multibit Delta-Sigma Converters," Accepted for publication in: Proceedings of Communication Systems, Networks and Digital Signal Processing, Jul. 2002.

E. Bach, "Multibit Oversampling D/A converters Using Dynamic Element Matching Methods," Siemens AG, Semiconductors Group, Mar. 3, 1999.

E. Fogelman, "A Dynamic Element Matching Technique for Reduced-Distortion Multibit Quantization in Delta-Sigma ADCs," IEEE Transactions on Circuits and Systems-II: Analog and Digital Signal Processing, vol. 48, No. 2, Feb. 2001.

Y. Geerts and M. Steyaert, "Guidelines for Implementation of CMOS Multibit Oversampling Modulators," K.U. Leuven, ESAT-MICAS, Jan. 1999.

H. Jensen, "A Low-Complexity Dynamic Element Matching DAC for Direct Digital Synthesis," IEEE Transactions on Circuits and Systems-II: Signal Processing, vol. 45, No. 1, Jan. 1998.

* cited by examiner

SYSTEM AND METHOD FOR COMPENSATING FOR ERROR IN A SIGMA DELTA CIRCUIT

RELATED APPLICATION

U.S. Provisional Application No. 60/458,909, Filed Mar. 28, 2003

BACKGROUND

The invention relates generally to systems and methods for compensating for error in signals generated in a sigma delta circuit.

Sigma delta circuits are well known in the art of both digital and analog circuit designs. A Sigma delta circuit is a closed loop control system having a non-linear quantizing element in the loop. A sigma delta control loop may be referred to as a "modulator" implying its use as a means to create a modulated stream of output data that is quantized in time and amplitude from a possibly continuous input signal. The conventional sigma delta generally includes an input for receiving a signal, a differencing element and a filter having a transfer function that is configured to shape the noise generated by the amplitude and time quantizing element in the loop. Errors occur in such systems including tones and fixed pattern noise that are produced in the sigma delta loop. Remedies have been attempted to cure such errors, including complex dither schemes or MASH ("MASH" is the common term for a method employed to create a high order noise shaping loop with a cascade of low order noise shaping loops. A MASH design may therefore avoid the necessity of stabilizing a high order loop. The design of a MASH architecture may also allow spurious noise to be reduced because that noise is measured by a second or succeeding modulators in the cascade of modulator loops).

In a conventional sigma delta loop, a filter function H(s) is applied to an input signal prior to a quantizer, which can be represented as a source of noise, $\epsilon$. Simple analysis of the loop shows: $H(s)(x-y)+\epsilon=y$ hence by rearrangement, assuming H is linear, and solving for y:

$$y = \frac{H(s) \cdot x}{1 + H(s)} + \frac{\varepsilon}{1 + H(s)}$$

from which we may extract the Signal Transfer function (STF)

$$STF = \frac{H(s)}{1 + H(s)}$$

and a Noise Transfer Function (NTF), to apply to $\epsilon$ the loop noise:

$$NTF = \frac{1}{1 + H(s)}$$

The results are well known by those skilled in the art. At frequencies where H(s) is large Y is a close approximation to X and $\epsilon$ is suppressed by a large quantity. For example, if H(s) is chosen to be $$H(s) = \frac{1e6}{s},$$

the noise is suppressed as frequency tends to zero and the signal has a limited bandwidth. The preceding analysis depends upon the assumption that the noise due to quantizing the signal may be represented as a uniform noise source $\epsilon$, this is found to be only approximately valid in real examples. The assumption that $\epsilon$ is uniform within a certain bandwidth would suggest that the noise is monotonically decreasing with frequency if H(s) is monotonically increasing. In practice, artifacts exist in the noise of the system often referred to as tones or other spurious none-harmonically related signals present in the output data stream (Y). Various techniques exist to remove or reduce these artifacts. In one method, the complexity, and thus the order, of the loop is increased by making H(s) a second or higher order function, or 'dither' is added to the loop in an attempt to redistribute the spurious noise across the bandwidth, lessening the effect at a particular frequency. (The addition of dither describes a process where an out-of-band signal is superimposed on the input signal—the intention begin to disturb the artifact signals and possibly move them out of band as well). Neither of these techniques is precise. Even a higher order loop will show some artifacts and dither is not entirely effective at re-distributing the spurious noise.

Thus, there still exists a need for better methods of suppressing noise in a sigma delta loop. As will be observed, the invention accomplishes this in an elegant manner.

DETAILED DESCRIPTION

Figure 1:
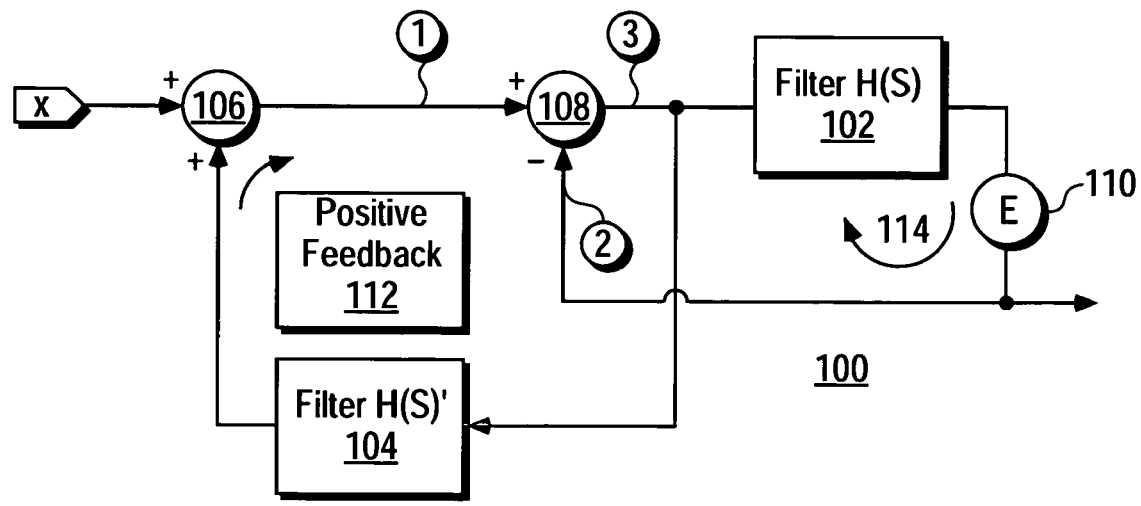
FIG. 1 is a block diagram of a sigma delta circuit according to the invention.

The invention is directed to a system and method configured to compensate a digital signal to remove artifacts such as tones and fixed pattern noise that occur in a sigma delta loop. The invention is further configured to suppress predictable noise due to a quantizer located in a sigma delta loop. Positive feedback is used to around the input to the sigma delta converter to feed a filtered version of the error signal, which is commonly the first integrator input, back into the input in such a manner so as to suppress all errors. Positive feedback loop gain is set to a number that is close to, but slightly less than unity. A value slightly less than unity is chosen because a positive feedback loop with a gain less than unity is stable, despite the fact that the feedback is positive.

Generally, in one embodiment, a system and method are provided for suppressing errors in a feedback control system. The errors may include, but are not limited to, those errors that may be generated within the feedback control system due to the presence of a quantizing element within the control system loop. A first feedback control system is augmented by use of an interlocking secondary control loop, thereby creating a new feedback control system composite of the first feedback control system and the secondary loop. The secondary control loop has elements of the first control loop within its loop, one of those elements being the input of the first control loop. The second control loop may be configured to have an over-all positive feedback with a gain that is less than unity. The second control loop provides the input point to the composite augmented control system.

In one embodiment, a sigma delta digital circuit is configured to compensate for output error and includes an input for receiving an analog input signal and an output configured to output a digital output signal. The sigma delta circuit further includes a summation component configured to add a first error voltage to an incoming input signal, and a subtraction component configured to subtract a second error voltage to an incoming input signal.

A sigma delta loop configured according to the invention contains a conventional sigma delta loop as a sub-component. For example, referring to FIG. 1, the differencing element 108, the filter element 102 and the quantizer 110 (here represented as a source of noise) are configured as a sigma delta modulator. According to the invention, another feedback loop is added that includes the modulator differencing element and the input signal. It is a characteristic of a circuit configured according to the invention that this further feedback loop will be seen to have overall positive feedback. This additional feedback loop is seen to contain the differencing element, filter element 104 notated as having a potentially different 10 characteristic H(s)', and a summation element 106. The elements 106, 108 and 104 constitute the novel feedback loop 112. Because element 106 is a summation element, this feedback loop has positive feedback.

Figure 2:
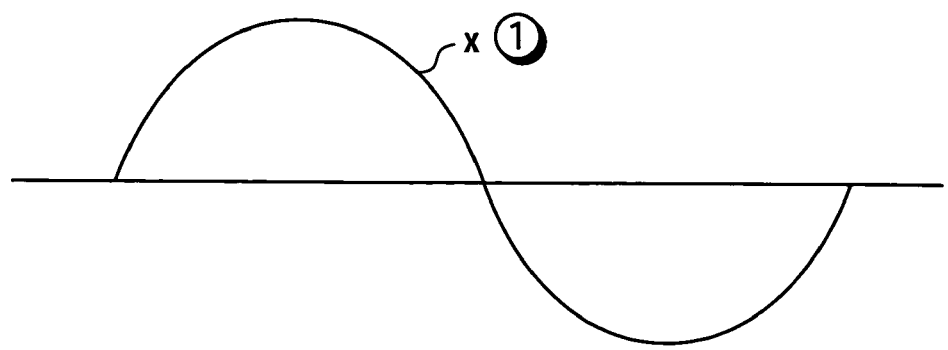
FIGS. 2-5 are graphical representations of signals occurring at different locations in the circuit while in operation.
Figure 3:
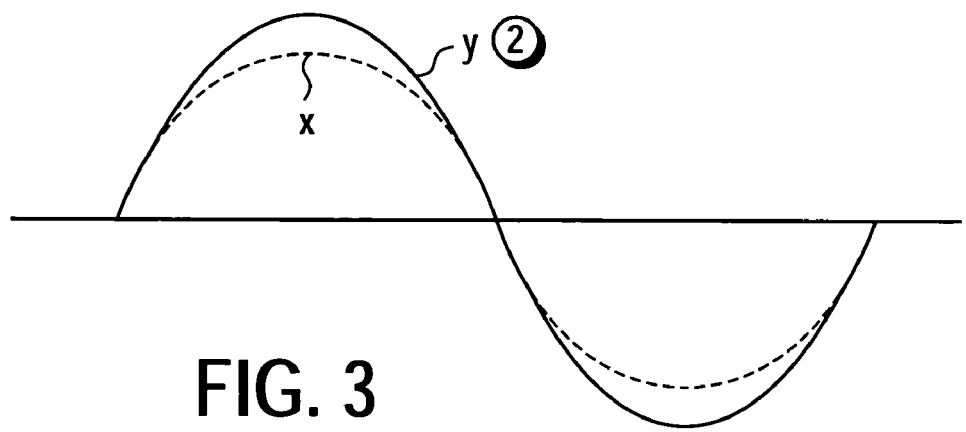
Figure 4:
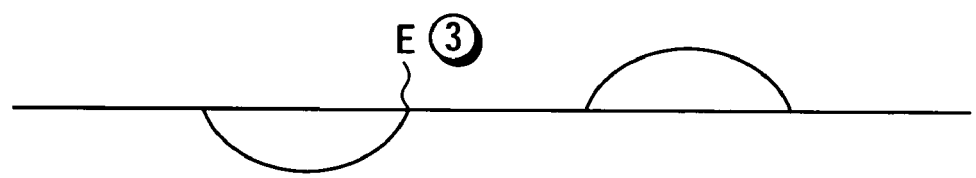
Figure 5:
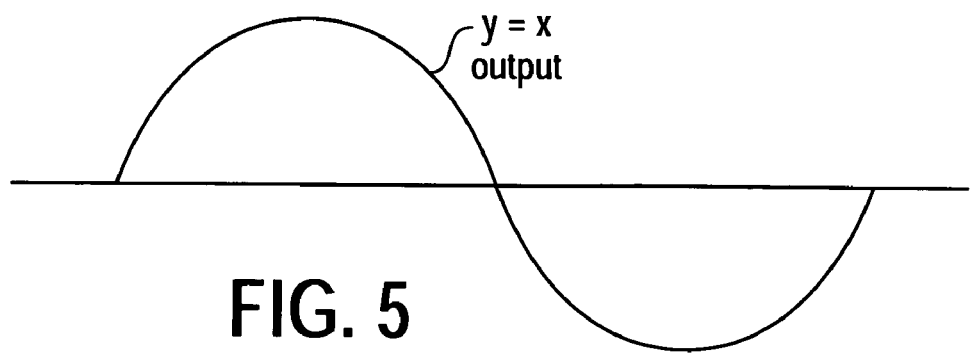

Still referring to FIG. 1, a sigma delta circuit 100 configured according to the invention is illustrated. An input signal "x" is input into the sigma delta loop 100, that is comprised of a first sigma delta filter circuit 102 having a first filter function H(s), and a second sigma delta filter circuit 104 having a second filter function H(s)'. A first adder 106 receives the input signal and adds it to the output of the second sigma delta filter. The first result signal "1" (illustrated as a signal output diagram in FIG. 2) is input into a second adder 108, which receives and subtracts a second result signal "2" (illustrated as a signal output diagram in FIG. 3), that is received from a quantizer "E" 110 that represents the quantizer in the sigma delta loop, to give a third result signal "3" (illustrated as a signal output diagram in FIG. 4). This third result signal is input to sigma delta filter 102, which is input into the quantizer 110. Generally, the sigma delta is comprised of a first positive feedback loop 112, which adds the input signal to third result signal "3", and a negative feedback loop 114, which subtracts the error signal generated by quantizer 110 from the first result "1", giving third result "3". The operation of this invention may by understood by observing that the conventional sigma delta loop 114 in FIG. 1 is the source of the artifacts—these artifacts are non linear and unpredictable, but they are nevertheless real signals within the sigma delta feedback loop. Therefore, these artifact signals are present at the output of the differencing element 108. The further loop of this invention is therefore able to process these artifacts in its positive feedback loop filter 104. The invention is constructed such that the overall transfer function suppresses these artifacts.

According to the invention, the following improvements then are provided. First, the loop order is increased to further suppress the signal at the H(s) input. Next, suppression of the artifacts in the sigma delta loop is accomplished by use of a positive feedback around the input section, positive feedback loop 112. In this loop, a second filter function, H'(s), is introduced to feed back to the input. Note that this feedback is positive.

The circuit analysis proceeds by first writing the expression for the embedded prior art sigma delta loop. Identifying x' (x prime) as the prior art modulator input (signal 1 FIG. 1) we may write; y=(STF')(x')+(NTF')(ε)

since this is the internal sigma delta loop and STF' and NTF' are the internal sigma delta loop signal and noise transfer functions respectively. Signal Y is the output signal, namely the signal notated as 2 in FIG. 1. Next, the positive feedback section, according to the invention, is added—here the signal x is the new input and H(s)' is the new loop filter:

$$x'=x+H'(s)\cdot(x'-y).$$

Substituting for x' since $$x' = \frac{y - NTF' \cdot \varepsilon}{STF'}$$

gives:

$$\frac{y - (NTF')(\varepsilon)}{STF'} = x + (H'(s))\left[\frac{y - (NTF')(\varepsilon)}{STF'} - y\right];$$

Solving for y in terms of x and ε, gives:

$$y = \frac{(STF')(x)}{[1 - (H'(s))(1 - STF')]} + \frac{(NTF')(\varepsilon)[1 - (H'(s))]}{[1 - (H'(s))(1 - STF')]}$$

Which, by inspection, can be seen as a similar expression to the original loop. Identifying the new loop STF and NTF $$y=(STF)(x)+(NTF)(\varepsilon)$$

gives $$STF = \frac{STF'}{[1 - (H'(s))(1 - STF')]} \quad NTF = \frac{(NTF')[1 - H'(s)]}{[1 - (H'(s))(1 - STF')]}$$

Suppose now that H'(s) is defined such that the maximum value of H(s)', for all s is less than 1.0. In this case, the positive feedback can never have sufficient gain to become unstable, but it can have sufficient gain (for (1−H'(s))<<1) to suppress the artifacts of the sigma delta loop.

For example if $$H'(s) = \frac{0.99 \cdot a}{a + s}$$

A single real pole with a gain 0.99 at low frequency, and, further, if STF'=1.0 at low frequency, which is the common case, then $$STF = \frac{STF'}{[1 - H'(s) \cdot (1 - STF')]} \quad NTF = \frac{NTF' \cdot [1 - H'(s)]}{[1 - H'(s) \cdot (1 - STF')]}$$

$$STF=1.0 \ NTF=NTF=NTF'\cdot[1-H'(s)]=NTF'\cdot(1-0.99)$$
$$=NTF'\cdot 0.01$$

The NTF has thus been reduced by a factor of 100 in this simple example.

A complete analysis in the s domain for a first order loop with a single real pole in the positive feedback with max gain 0.99 shows the following results. For example, in practice, if $$H(s) = \frac{1e6}{s} \text{ and } H'(s) = \frac{0.99 \cdot 300 \text{ k}}{300 \text{ k} + s},$$

the positive feedback of the filter is $$H'(s) = \frac{0.99 \cdot 300k}{300k + s}$$

This configuration has progressively improved the noise to a maximum of 40 db at the 3 khz point. At this point the limited gain of 0.99 allows for substantially no further improvement. Clearly, as f, 0.99 in this case, tends to 1.0, the effect will improve substantially indefinitely, limited only by the requirement that f<1.0. This result then shows that, theoretically, any artifact at the H(s) loop input should be suppressed by this mechanism that incorporates the invention. In practice, in order to prove this, the 2nd order loop shown in FIG. 1 was run with a circuit incorporating the invention in place. A 400 khz pole with a maximum gain of 0.999 was used in this digital sigma delta modulator. There was a significant improvement in noise and, more importantly, in the spurious distortion products as well.

The invention has been described with reference to sigma delta loop configured to suppress artifacts in signals caused by the sigma delta circuit components. It will be appreciated by those skilled in the art, however, that the invention has broader utility. Other embodiments may be implemented according to the invention without departing from the spirit and scope of the invention, the scope of which is to be construed in accordance with the appended claims and their equivalents.

The invention claimed is:

1. A method of compensating for output error in a sigma delta circuit, comprising:
   receiving an input signal;
   adding a first error voltage value, which is derived from an output signal, to the input signal;
   subtracting a second error value, which is derived from the adding of a first error voltage value, to the input signal from the input signal; and
   outputting an output signal result from the sigma delta circuit.

2. A sigma delta digital circuit configured to compensate for output error, comprising:
   an input for receiving an input signal;
   an output configured to output an output signal;
   a summation component configured to add a first error voltage value, which is derived from an output signal, to an incoming input signal; and
   a subtraction component configured to subtract a second error voltage value, where the second error voltage value is derived from the adding of a first error voltage value to an incoming input signal.

3. A sigma delta digital circuit according to claim 2, further comprising a filter configured to filter an input signal according to a filter function, wherein the filter generates noise that distorts the filtered input signal, wherein the distortion results in the first error value.

4. A sigma delta digital circuit according to claim 2, further comprising a filter configured to filter an input signal according to a filter function, wherein the filter generates noise that distorts the filtered input signal, wherein the distortion results in the second error value.

5. A circuit producing low-noise output from a sigma delta modulator (SDM), the circuit including:
   an input,
   a first connection point electrically coupled to the input,
   a second connection point electrically coupled to the first connection point, a third connection point electrically coupled to the second connection point,
   an SDM electrically coupled to the third connection point,
   an SDM output electrically coupled to the SDM,
   a positive feedback loop from the third connection point to the first connection point, adding the positive feedback signal to the input signal; and
   a negative feedback loop from the SDM output, after quatization, to the second connection point, subtracting the negative feedback signal from the signal at the second connection point.

6. The circuit of claim 5, further including a filter having a gain of less than unity position in the positive feedback loop, between the first and third connection points.

7. A method of producing low-noise output from a sigma delta modulator (SDM) loop, including:
   providing positive feedback to the input from a point within the SDM loop, the point taken between a differencing element that combines negative feedback from a quantizer with the input and a filter element.

8. The method of claim 7, further including filtering the positive feedback before combining it with the input, with a filtering gain of less than unity.

9. The method of claim 8, wherein the filtering gain is greater than or equal to 0.99.

10. The method of claim 8, wherein the filtering gain is greater than or equal to 0.999.

11. The method of claim 8, wherein the filtering is implemented using a filter having a single real pole.

* * * * *